United States Patent [19]

Stout et al.

[11] Patent Number: 5,035,769
[45] Date of Patent: Jul. 30, 1991

[54] NONDESTRUCTIVE METHOD FOR CHEMICALLY MACHINING CRUCIBLES OR MOLDS FROM THEIR ENCLOSED INGOTS AND CASTINGS

[75] Inventors: Norman D. Stout; Herbert W. Newkirk, both of Livermore, Calif.

[73] Assignee: The United States of America as represented by the United States Department of Energy, Washington, D.C.

[21] Appl. No.: 417,146

[22] Filed: Oct. 4, 1989

[51] Int. Cl.$^5$ .............................................. B44C 1/22
[52] U.S. Cl. .................................. 156/639; 156/664; 252/79.5
[58] Field of Search ....................... 156/637, 639, 664; 252/79.5

[56] References Cited

U.S. PATENT DOCUMENTS

| | | | |
|---|---|---|---|
| 1,938,313 | 12/1933 | Bechak | 156/639 |
| 2,472,304 | 6/1949 | Mason | 252/79.5 |
| 2,536,912 | 1/1951 | Corbett | 156/637 |
| 2,916,363 | 12/1959 | Doro | 156/639 |
| 3,244,094 | 4/1966 | Gresham | 156/639 |
| 3,411,999 | 11/1968 | Weinberg | 156/637 |
| 3,614,662 | 10/1971 | Monchamp et al. | |
| 3,677,712 | 7/1972 | Tolksdorf | |
| 3,788,914 | 1/1974 | Gumbelevicius | 156/639 |
| 3,890,187 | 6/1975 | Glenn | 156/637 |
| 3,951,729 | 4/1976 | Takagi et al. | |
| 4,348,254 | 9/1982 | Lindmayer | 252/79.5 |
| 4,426,253 | 1/1984 | Kreuz et al. | 252/79.5 |
| 4,456,630 | 6/1984 | Basol | 252/79.5 |
| 4,525,460 | 6/1985 | Petrosian et al. | |
| 4,545,918 | 10/1985 | Pralus | 252/79.5 |
| 4,563,239 | 1/1986 | Adinolfi et al. | 156/664 |
| 4,588,474 | 5/1986 | Gross | 252/79.5 |
| 4,627,064 | 12/1986 | Auzel et al. | |
| 4,789,424 | 12/1988 | Fornadel et al. | 156/639 |

FOREIGN PATENT DOCUMENTS

| | | | |
|---|---|---|---|
| 0251854 | 11/1987 | Fed. Rep. of Germany | 156/639 |
| 0021335 | 2/1983 | Japan | 156/639 |
| 0136033 | 6/1987 | Japan | 156/639 |
| 0136034 | 6/1987 | Japan | 156/639 |
| 0018230 | 1/1989 | Japan | 156/639 |

OTHER PUBLICATIONS

Stockbarger, Review of Scientific Instruments 7,133 (1936).
Reshetnikov et al., Journal of Inorganic Chem. USSR vol. III, No. 2, 177(1958).

Primary Examiner—David L. Lacey
Assistant Examiner—Lori Johnson
Attorney, Agent, or Firm—L. E. Carnahan; Henry P. Sartorio; William R. Moser

[57] ABSTRACT

An inventive method is described for chemically machining rhenium, rhenium and tungsten alloy, and group 5b and 6b crucibles or molds from included ingots and castings comprised of oxide crystals including YAG and YAG based crystals, garnets, corundum crystals, and ceramic oxides. A mixture of potassium hydroxide and 15 to 90 weight percent of potassium nitrate is prepared and maintained at a temperature above melting and below the lower of 500 degrees centigrade or the temperature of decomposition of the mixture. The enveloping metal container together with its included oxide crystal object is rotated within the heated KOH-KNO$_3$ mixture, until the container is safely chemically machined away from the included oxide crystal object.

2 Claims, 1 Drawing Sheet

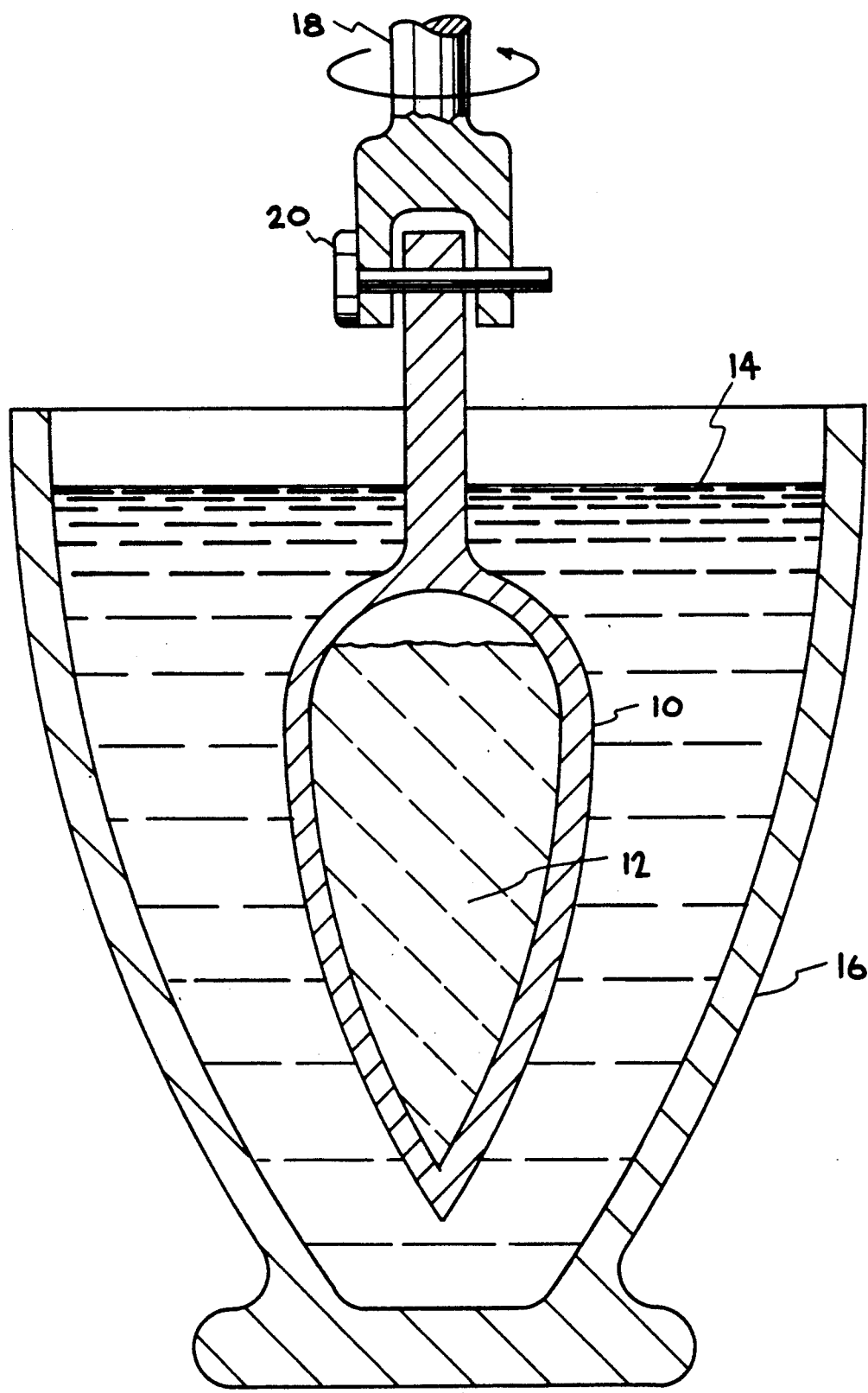

NONDESTRUCTIVE METHOD FOR CHEMICALLY MACHINING CRUCIBLES OR MOLDS FROM THEIR ENCLOSED INGOTS AND CASTINGS

The U.S. Government has rights in this invention pursuant to Contract No. W-7405-ENG-48 between the U.S. Department of Energy and the University of California for the operation of the Lawrence Livermore National Laboratory.

BACKGROUND OF THE INVENTION

The invention described herein relates generally to methods used in chemical machining, and more particularly to methods used for removing confining crucibles or molds from ingots and castings that are comprised of various oxide crystals including YAG and YAG based crystals, garnets, corundum crystals, and ceramic oxides, and that are prepared by either the Bridgman/Stockbarger melt growth technique or the permanent-mold casting method.

Chemical machining is the removal by chemical dissolution of material from exposed surfaces of a workpiece. Selective attack on different areas of the workpiece may be controlled by masking or partial immersion. Known chemical machining agents include solutions of sodium hydroxide for aluminum and solutions of hydrochloric and nitric acids for steel. Chemical machining is often used in the manufacture of solid state electronic components.

Melt growth is the best method for rapidly growing large single crystals of high perfection. The most straightforward and inexpensive melt growth technique is normal freezing, wherein a molten ingot contained in a crucible is gradually frozen from one end to the other. When this is achieved by the use of a two-zone furnace, it is called the Bridgman/Stockbarger method, which is described by D. C. Stockbarger in Reviews of Scientific Instruments 7, pages 133 to 136 (1936). The usual configuration is vertical with the melt in a crucible being lowered slowly from the hot zone to the cooler zone which is below the melting point. Petrosian et al, in U.S. Pat. No. 4,525,460 issued June 25, 1985 discuss the preparation of YAG or yttrium aluminum garnet ($Y_3Al_5O_{12}$) based crystals by the Bridgman/Stockbarger method, employing a molybdenum crucible or container, at column 2, line 30. In many instances using the Bridgman/Stockbarger technique, the crucible must be removed from the ingot by mechanical means, often with the aid of a lathe or a milling machine. A device for removing gasses from a melt within which monocrystals are being grown is taught by Tolksdorf in U.S. Pat. No. 3,677,712 issued July 18, 1972.

Unconfined crystals can be grown by the well known crystal pulling or Czochralski technique. Unfortunately, this method generally yields crystals that are relatively small and often difficult to control in shape. Various aspects of this technique are employed by Monchamp et al in U.S. Pat. No. 3,614,662 issued Oct. 19, 1971; by Takagi et al in U.S. Pat. No. 3,951,729 issued Apr. 20, 1976; and, by Auzel et al in U.S. Pat. No. 4,627,064 issued Dec. 2, 1986.

In permanent-mold casting, a fluid material is poured into a mold and allowed to freeze, to thereby provide a casting of the material. In many situations the casting can be ejected from the mold, and the mold re-used; however, that is not the case in situations within the purview of this application, wherein the mold must be machined away, for example by turning or milling, from the casting.

The methods of this invention are particularly advantageous with respect to the preparation of very hard and brittle crystalline oxide materials that can be easily broken and destroyed when subjected to the vibratory action of machinery when, in ingot or casting form, their enclosing crucible or mold is being machined away by turning or milling. This method is further particularly advantageous for removing crucibles and molds of complex shape which would be expensive, time consuming, or impossible to remove by conventional machining methods. These oxide crystal materials include, but are not limited to: YAG or yttrium aluminum garnet ($Y_3Al_5O_{12}$) based crystals; garnets, which are silicates of the general chemical formula $A_3B_2(SiO_4)_3$ where the A cations are dominantly $Fe^{+2}$, $Mn^{+2}$, $Mg^{+2}$, and $Ca^{+2}$ and the B cations are $Al^{+3}$, $Fe^{+3}$ and $Cr^{+3}$; corundum crystals which are of the basic chemical formula $Al_2O_3$ and include ruby, amethyst, emerald, topaz, and sapphire; and, ceramic oxides which are ceramic products composed of crystalline component oxides, which are well known in the prior art and are described, for example, in the textbook "Oxide Ceramics" by Eugene Ryshkewitch, Academic Press, New York and London (1960), which textbook is incorporated by reference herein. These hard and brittle oxide crystal materials are frequently prepared in crucibles or molds comprised of the group 5b and 6b metals, which are vanadium, niobium, tantalum, chromium, molybdenum, and tungsten, as well as in crucibles or molds comprised of rhenium or rhenium and tungsten alloy. These very high melting temperature metals can only be worked and machined with great difficulty. Consequently, the mechanical removal of these crucibles and molds is very time consuming, expensive, and labor intensive, and often results in severe damage or destruction to their included crystalline ingots and castings.

SUMMARY OF THE INVENTION

It is, therefore, an object of the invention to provide methods for chemically machining rhenium, rhenium and tungsten alloy, and group 5b and 6b metals.

Another object of the invention is to provide methods, for chemically machining rhenium, rhenium and tungsten alloy, and group 5b and 6b metals, that employ chemical machining agents that are not harmful to oxide crystals that include YAG and YAG based crystals, garnets, corundum crystals, and ceramic oxides.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purposes of the present invention, as embodied and broadly described herein, an inventive method is provided for chemically machining enveloping containers comprised of rhenium, rhenium and tungsten alloy, and group 5b and 6b metals, which are vanadium, niobium, tantalum, chromium, molybdenum, and tungsten, from included objects comprised of oxide crystal materials such as YAG, garnet, corundum crystal, and ceramic oxide. The method comprises preparing a mixture consisting of potassium nitrate and potassium hydroxide, with the mixture being 15 to 90 percent potassium nitrate by weight. The mixture is maintained at an elevated temperature above its melting temperature and below the lower of its decomposition temperature or 500 degrees centigrade. The enveloping container and its included object are rotated within the heated mixture, at a rate of rotation within the range extending from approximately 30 to 100 revolutions per minute, until the enveloping container is removably chemically machined from the included object.

The benefits and advantages of the present invention, as embodied and broadly described herein, include, inter alia, a method for chemically machining rhenium, rhenium and tungsten alloy, and group 5b and 6b metals that employs chemical machining agents that are not harmful to oxide crystals that include YAG and YAG based crystals, garnets, corundum crystals, and ceramic oxides.

BRIEF DESCRIPTION OF THE DRAWING

The accompanying drawing, which is incorporated into and forms a part of the specification, illustrates an embodiment of the invention and, together with the description, serves to explain the principles of the invention. In the drawing:

The FIGURE is a cross-sectional side view of typical apparatus used in carrying out the method of this invention.

DETAILED DESCRIPTION OF THE INVENTION

Reference is now made in detail to the presently preferred methodology of this invention, as illustrated in the drawing. The Figure illustrates a typical preferred application of the invention. An enveloping container 10, shown as a crucible, but that in other applications could be a mold or any other receptacle, is comprised of a metal selected from the group consisting of vanadium, niobium, tantalum, chromium, molybdenum, tungsten, rhenium, and any rhenium and tungsten alloy. Container 10 confines an included object 12, shown as an ingot, but that in other applications could be a casting or any other similar article, that is comprised of an oxide crystal material selected from the group consisting of YAG, YAG based crystal, garnet, corundum crystal, and ceramic oxide, all of which have been described hereinabove. A mixture 14, consisting of potassium nitrate ($KNO_3$) and potassium hydroxide (KOH), and containing 15 to 90 percent potassium nitrate by weight, is shown prepared and contained within a platinum crucible 16. However, in other applications crucible 16 may be comprised of any material that is essentially not prone to attack by mixture 14, especially after mixture 14 has been heated.

Mixture 14 must be maintained at an elevated temperature above its melting temperature but below the lower of its decomposition temperature or 500 degrees centigrade. This may be accomplished by means, not shown, such as those employing burner flames or furnaces, that are very well known in the chemical, engineering, and related arts. The melting temperature in degrees centigrade, of $KOH-KNO_3$ mixtures, as a function of the KOH weight percent, may be readily obtained from data provided by Reshetnikov et al in Journal of Inorganic Chemistry, U.S.S.R., Volume III, Number 2, pages 177 to 192 (1958), originally published as Zhurnal Neorganicheskoi Khimii, Volume III, Number 2, pages 366 to 377 (1958), both of which papers are incorporated by reference herein.

Container 10 and its included oxide crystal object 12 are rotated within heated mixture 14, by means of a rod 18 and a screw 20 arrangement, that may be comprised, for example, of platinum, and is very schematically indicated, at a rate of rotation within the range extending from approximately 30 to 100 revolutions per minute, until container 10 is removably chemically machined from object 12.

By way of an example, a mixture of 84.4 weight percent (75 mole percent) of potassium nitrate and 15.6 weight percent (25 mole percent) of potassium hydroxide was prepared and melted in a platinum crucible, such as crucible 16 of FIG. 1. A molybdenum crucible containing a YAG crystal, corresponding to container 10 and object 12 of FIG. 1, was suspended within the molten potassium nitrate and potassium hydroxide mixture and rotated at a rate of approximately 30 revolutions per minute. When the temperature of the molten mixture was just at or slightly above the melting temperature, about 250 degrees centigrade, the rate of surface thickness removal by chemical machining of the molybdenum crucible was very low, approximately 0.5 to 1.0 mil per hour. The surface thickness removal rate was observed to increase with the temperature of the molten $KNO_3$-KOH mixture, being much more rapid and yet quite controllable at about 350 degrees centigrade, but being runaway and exothermic as the temperature approached about 600 degrees centigrade. Chemical reactions during this last condition were very vigorous, and exothermic runaway could only be stopped by removing the molybdenum crucible from the molten $KNO_3$-KOH mixture.

In general, it is observed that the rate of surface thickness removal of rhenium, rhenium and tungsten alloy, and group 5b and group 6b metals by the chemical machining method of this invention increases with both $KNO_3$-KOH mixture temperature, and with the $KNO_3$ concentration within the $KNO_3$-KOH mixture. For this reason, the $KNO_3$ concentration in the $KNO_3$-KOH mixture must be at least 15 percent, by weight.

By way of a second example, YAG crystal left in a mixture of 84.4 weight percent of potassium nitrate and 15.6 weight percent of potassium hydroxide, at 600 degrees centigrade for a time in excess of 16 hours, was recovered intact and undamaged, save for a very slight amount of visible surface etching that was associated with an almost imperceptible amount of weight loss. The YAG crystal so treated was not damaged and in every way fit for its intended use.

It is thus appreciated that in accordance with the invention as herein described and shown in the Figure, a method for chemically machining rhenium, rhenium and tungsten alloy, and group 5b and 6b metals that employs chemical machining agents that are not harmful to oxide crystals that include YAG and YAG based crystals, garnets, corundum crystals, and ceramic oxides, has been provided.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, it is believed that various mixtures of other alkali nitrates, or nitrites, and other alkali hydroxides, may be used to chemically machine various enveloping containers of a nature and composition similar to those discussed above, by methods and techniques similar to those discussed herein. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for removing an enveloping container, comprised of a metal selected from the group consisting of vanadium, niobium, tantalum, chromium, molybdenum, tungsten, rhenium, and any rhenium and tungsten alloy, from an included object, comprised of an oxide crystal material selected from the group consisting of YAG, YAG based crystal, garnet, corundum crystal, and ceramic oxide, the method comprising the steps of:

preparing a mixture consisting of potassium nitrate and potassium hydroxide, with said mixture being 15 to 90 percent potassium nitrate by weight;

maintaining the mixture at an elevated temperature above its melting temperature and below the lower of its decomposition temperature or 500 degrees centigrade; and rotating the enveloping container together with the included object within the mixture maintained at said elevated temperature, at a rate of rotation within the range extending from approximately 30 to 100 revolutions per minute, until the enveloping container is removably chemically machined from the included object.

2. A method, as recited in claim 1, further comprising the step of jointly adjusting both the chemical composition of the potassium nitrate and potassium hydroxide mixture and the temperature of the mixture, to thereby control the rate at which the enveloping container is chemically machined from the included object.

* * * * *